United States Patent
Probst

(10) Patent No.: US 9,814,151 B2
(45) Date of Patent: Nov. 7, 2017

(54) MOBILE ELECTRONIC DEVICE FACEPLATE BORDER AND RELATED METHODS

(71) Applicant: NLU Products, L.L.C., Lehi, UT (US)

(72) Inventor: Brian Hullinger Probst, Orem, UT (US)

(73) Assignee: NLU Products, L.L.C., Lehi, UT (US)

( * ) Notice: Subject to any disclaimer, the term of this patent is extended or adjusted under 35 U.S.C. 154(b) by 92 days.

(21) Appl. No.: 14/604,349

(22) Filed: Jan. 23, 2015

(65) Prior Publication Data

US 2016/0095241 A1    Mar. 31, 2016

Related U.S. Application Data

(60) Provisional application No. 62/056,379, filed on Sep. 26, 2014.

(51) Int. Cl.
| | |
|---|---|
| *H05K 5/03* | (2006.01) |
| *H04M 1/02* | (2006.01) |
| *H04B 1/00* | (2006.01) |
| *H04B 1/3888* | (2015.01) |
| *H04B 1/3827* | (2015.01) |
| *H04M 1/18* | (2006.01) |

(52) U.S. Cl.
CPC ............ *H05K 5/03* (2013.01); *H04B 1/3838* (2013.01); *H04B 1/3888* (2013.01); *H04M 1/0266* (2013.01); *H04M 1/185* (2013.01)

(58) Field of Classification Search
CPC ... G06F 1/1656; G06F 1/1613; H04N 5/2252; B65D 85/30
See application file for complete search history.

(56) References Cited

U.S. PATENT DOCUMENTS

| | | |
|---|---|---|
| D627,343 S | 11/2010 | Andre et al. |
| 2011/0279383 A1 | 11/2011 | Wilson et al. |
| 2012/0243110 A1* | 9/2012 | Robinson ............ G02B 25/002 359/742 |
| 2013/0295310 A1 | 11/2013 | Tages et al. |
| 2013/0316112 A1 | 11/2013 | Leonhard et al. |
| 2014/0152890 A1 | 6/2014 | Rayner |
| 2015/0246515 A1* | 9/2015 | Patel .................. B29C 63/0004 156/579 |

* cited by examiner

*Primary Examiner* — Nizar Sivji
(74) *Attorney, Agent, or Firm* — Thorpe North & Western, LLP

(57) ABSTRACT

Presented and described herein are faceplate borders and screen protectors for use on mobile electronic devices. Further presented is a method of attachment for the screen protector described herein and a method of minimizing separation of a screen protector from a mobile electronic device.

16 Claims, 12 Drawing Sheets

MOBILE ELECTRONIC DEVICE FACEPLATE BORDER AND RELATED METHODS

PRIORITY DATA

This application claims the benefit of U.S. Provisional Patent Application Ser. No. 62/056,379 filed on Sep. 26, 2014 which is incorporated herein by reference.

BACKGROUND

Mobile electronics are used by millions of people each day. Smart phones, tablets, music players, and other devices have become an integrated part of everyday life and are used for communication, information retrieval, scheduling, entertainment, and numerous other daily activities. In the course of use, devices are subjected to physical wear and tear as well as to accidental damage such as being dropped, scratched, crushed etc.

Nearly all mobile electronic devices include a screen or visual interface (i.e. a faceplate) that allows a user of the device to navigate software menus and interact with the device. Touch screens are routinely exposed and vulnerable to scratches, impacts, etc. Screen protectors can provide protection for the screen of an electronic device under a wide variety of potentially harmful conditions while, at the same time, being unobtrusive to use on the device and largely maintain functionality and appearance of the device. As a result, screen protectors, along with a number of other accessory devices such as cases have been developed; however, with the evolution of mobile devices their size and weight are being consistently reduced and their shapes are becoming more complex. This poses an ongoing challenge to the makers of the afore-mentioned accessories.

SUMMARY

Accordingly, invention embodiments, provide a faceplate border for minimizing exposure of an edge of a screen protector coupled to a screen of a mobile electronic device. In one embodiment, such a border can include an interior edge that is oriented toward the screen protector; an exterior edge that is oriented away from the screen protector; an attachment surface that extends between the interior and exterior edges; and an exterior surface that extends between the interior and exterior edges. In one embodiment the attachment surface has a shape that substantially matches a shape or configuration of a surface of a portion of the mobile electronic device to which the border is to be attached. In one embodiment, the surface portion of the mobile electronic device to which the border is to be attached can be a curved or rounded shape. In another embodiment, the border can be configured to abut a perimeter edge of the screen protector and minimize exposure of the transition area between the screen protector and the face plate on the mobile electronic device.

Also presented, are methods of attaching the faceplate borders as described above. In one embodiment, an adhesive can be applied to the attachment surface of the border and the border is placed on the mobile electronic device. In another embodiment, the border described herein can comprise elastomeric materials and when applied the border engages the device through suction, a cling-type adhesion (such as a static cling), or through other frictional or elastomeric forces. In yet another embodiment, the border may be attached to a back plate engaging a back side of the mobile electronic device. Further presented is a method of covering a side edge of a screen protector of a mobile electronic device, or covering a side or edge of a mobile electronic device by applying the border as described herein.

In another embodiment, a screen protector for a mobile electronic device is presented. The screen protector can comprise a substantially transparent barrier component that covers at least a portion of a viewing screen of the mobile electronic device and a faceplate border. In some embodiments, the barrier can cover a flat portion of a view screen of the mobile electronic device. In some embodiments, the border is a different material than the barrier. The border can be configured as recited herein. In some embodiments, the border can be attached to the transparent barrier and can also be integral therewith or a single piece or unit. In other embodiments, the border can be separate and used in combination with the transparent barrier in order to maximize the operation and function of the transparent barrier. In some aspects, a system or assembly comprising a substantially transparent barrier and a faceplate border can be provided in a single kit or package and can optionally include a set of instructions for installation and/or use on a mobile electronic device and installation materials, such as adhesive layers, backing materials, etc. which can be provided for the transparent barrier, the faceplate border, or both. In some embodiments, the flat barrier component can comprise a glass or glass material, such as a tempered glass treated with an anti-glare finish. In other embodiments, the flat barrier can be a transparent or substantially transparent polymeric material and can be rigid, semi-rigid, or flexible.

Further presented, is a method of attaching a screen protector to a mobile electronic device. In one embodiment, an adhesive is used to attach a barrier component to the view screen. Then, a faceplate border as recited herein is placed around the perimeter edge of the barrier component and secured to an underlying electronic device. In one embodiment, the method of attaching a screen protector to a mobile device can include placing a barrier component over the view screen and using an adhesive to attach a faceplate border as recited herein. In another embodiment, a barrier component is placed on a portion of a view screen of an electronic mobile device and a faceplate border made of elastomeric material is used to engage a portion of the barrier component and the mobile electronic device holding both the barrier component and border in place through suction, a cling-type adhesion, or through other frictional or elastomeric forces on the electronic mobile device.

Additionally presented, is a method of minimizing separation of a screen protector from a viewing screen of a mobile electronic device. In one embodiment, the method includes securing a border as recited herein to a mobile device adjacent to, or overlapping an edge of the screen protector. For example, in one embodiment, such a method can include placing a screen protector on the viewing screen of a mobile electronic device or acquiring a mobile electronic device with a screen protector already installed on the faceplate (i.e. view screen); and placing a border that abuts or overlaps at least one edge of the screen protector on the mobile electronic device.

Further presented, is an assembly including a mobile electronic device, a substantially transparent barrier component configured to cover and protect a viewing screen of the mobile electronic device (i.e. a screen protector), and a faceplate border as recited herein.

Thus has been outlined, rather broadly, various features of the invention so that the detailed description thereof that follows may be better understood, and so that the present contribution to the art may be better appreciated. Other features of the present invention will become clearer from the following detailed description of the invention, taken with the accompanying drawings and claims, or may be learned by the practice of the invention.

BRIEF DESCRIPTION OF THE DRAWINGS

Features and advantages of the invention will be apparent from the detailed description that follows, and which taken in conjunction with the accompanying drawings, together illustrate features of the invention. It is understood that these drawings merely depict exemplary embodiments and are not, therefore, to be considered limiting of its scope. Furthermore, it will be readily appreciated that the components, as generally described and illustrated in the figures herein, could be arranged and designed in a wide variety of different configurations.

DETAILED DESCRIPTION

Figure 1:
FIG. 1 schematically shows a view of the exterior surface of a faceplate border device according to one invention embodiment.

Reference will now be made to exemplary embodiments and specific language will be used herein to describe the same. It will nevertheless be understood that no limitation of the scope of the present invention is thereby intended. Alterations and further modifications of the inventive features described herein, and additional applications of the principles of the invention as described herein, which would occur to one skilled in the relevant art and having possession of this disclosure, are to be considered within the scope of the invention. Further, before particular embodiments are disclosed and described, it is to be understood that this invention is not limited to the particular process and materials disclosed herein as such may vary to some degree. It is also to be understood that the terminology used herein is used for the purpose of describing particular embodiments only and is not intended to be limiting, as the scope of the present invention will be defined only by the appended claims and equivalents thereof.

It must be noted that, as used in this specification and the appended claims, the singular forms "a," "an," and "the" include plural referents unless the context clearly dictates otherwise. Thus, for example, reference to "a border" includes one or more of such borders and reference to "a cut out" includes reference to one or more of such cut outs.

As used herein, "attachment side" refers to the side of a transparent barrier or border device that faces a mobile electronic device to which the transparent barrier or border device is to be secured.

As used herein "exterior side" refers to the side of a device or structure or part thereof that faces outwardly from the device, structure, or part thereof. For example, an exterior side of a screen protector or transparent barrier component functioning as a screen protector may be a side facing toward a user when in use, while by comparison, an attachment side is a side of the screen protector facing a mobile electronic device to which the screen protector is coupled. Similarly, an exterior side of a border device can be a side that is visible or faces toward a user while an attachment side faces a mobile electronic device to which the screen is coupled. The exterior side is the side of the component that faces outward or outmost and is exposed following attachment.

As used herein, the term "side" can refer to a surface that forms the outside of, or bounds a thing or device. When referencing a structure or device the term "side" can be used with other descriptors to provide particularity, such as "front side," "back side," "top side," "bottom side," etc. When used alone the term "side" generally means a surface connecting front and back and/or top and bottom areas or sides of a device. Further, a "side" can be a surface that extends between two perimeter edges of a structure or device. In some aspects, such areas can also be referred to as a "perimeter side," or "perimeter sides."

As used herein, "curved" and "rounded" may be used interchangeably and refer to any shape that includes, has, or is a continuously bending line. Exemplary structures that can be "curved" or "rounded" include without limitation a side, corner, face, back or edge of a device, including a mobile electronic, a border device, or a transparent barrier device intended to protect a view screen of a mobile device. In some embodiments, a curved or rounded structure may be circular or semi-circular in shape or have a portion thereof with such shape.

As used herein, an "edge" refers to a length along which two planes, intersect, meet, or join. Typically, an edge refers to a side of such intersection, meeting, or junction that is 90° or greater. In terms of a structure or device, an edge can exist as a transition between surfaces of the structure, for example between a face or back and a side, top, or bottom, or between sides and top and bottom. In cases where an edge is curved or rounded, no angle may be present and the edge may be the curve that transitions from one plane to another, for example from a horizontal plane to a vertical plane. In terms of a structure or device, a curved or rounded edge can be a curved surface that transitions from one surface of the structure to another. For example, and edge can transition between a face or back of the structure to a side or top or bottom of the structure, or between a side of the structure and a top or bottom of the structure.

As used herein, "perimeter" refers to an outer boundary of a surface. As such, a "perimeter edge" refers to an edge defining an outer boundary of a surface. In some aspects the perimeter edge can be a curved or rounded edge.

As used herein, the term "faceplate" refers to the front of a mobile electronic device that includes a viewing screen where an image is displayed.

As used herein, a "faceplate border" or "border" refers to a border that is applied to a portion of the front of the viewing screen on a mobile electronic device. In some embodiments, the "faceplate border" or "border" can extend to other portions of the mobile electronic device. "Faceplate border," "border," and "border device" can be used interchangeably herein.

As used herein, the terms "barrier component" and "barrier" refers to a barrier that is applied to protect the viewing screen of a mobile electronic device and can be applied to all or a portion of the front of the viewing screen on a mobile electronic device. "Barrier component" and "barrier" can be used interchangeably herein and have the same meaning Typically a barrier component will be transparent or substantially transparent. Such components may be commonly referred to as a "screen protector" and such terms can be used interchangeably herein, though in some specific embodiments the term "screen protector" can be used to also refer to not only a barrier component, but also a barrier component with an integral, attached, or associated faceplate border.

As used herein, "viewing screen," "view screen," and "screen," can be used interchangeably and have the standard and routine meaning for such terms in the relevant art. For example, such terms can refer to a transparent or substantially transparent member or portion of an electronic device which allows viewing and optionally navigation or control of a graphic user interface (GUI) of the device.

As used herein, "substantial" or "substantially" when used in reference to a quantity or amount of a material, or a specific characteristic thereof, refers to an amount that is sufficient to provide an effect that the material or characteristic was intended to provide. The exact degree of deviation allowable may in some cases depend on the specific context. Similarly, "substantially free of" or the like refers to the lack of an identified element or agent in a composition. Particularly, elements that are identified as being "substantially free of" are either completely absent from the composition, or are included only in amounts which are small enough so as to have no measurable effect on the composition.

As used herein, "about" refers to a degree of deviation based on experimental error typical for the particular property identified. The latitude provided the term "about" will depend on the specific context and particular property and can be readily discerned by those skilled in the art. The term "about" is not intended to either expand or limit the degree of equivalents which may otherwise be afforded a particular value. Further, unless otherwise stated, the term "about" shall expressly include "exactly," consistent with the discussion below regarding ranges and numerical data.

As used herein, "adjacent" refers to the proximity of two structures or elements. Particularly, elements that are identified as being "adjacent" may be either abutting or connected. Such elements may also be near or close to each other without necessarily contacting each other. The exact degree of proximity may in some cases depend on the specific context.

In this disclosure, "comprises," "comprising," "comprised," "containing" and "having" and the like can have the meaning ascribed to them in U.S. patent law and can mean "includes," "including," and the like, and are generally interpreted to be open ended terms. The term "consisting of" is a closed term, and includes only the devices, methods, compositions, components, structures, steps, or the like specifically listed, and that which is in accordance with U.S. patent law. "Consisting essentially of" or "consists essentially" or the like, when applied to devices, methods, compositions, components, structures, steps, or the like encompassed by the present disclosure, refers to elements like those disclosed herein, but which may contain additional structural groups, composition components, method steps, etc. Such additional devices, methods, compositions, components, structures, steps, or the like, etc., however, do not materially affect the basic and novel characteristic(s) of the devices, compositions, methods, etc., compared to those of the corresponding devices, compositions, methods, etc., disclosed herein. In further detail, "consisting essentially of" or "consists essentially" or the like, when applied to devices, methods, compositions, components, structures, steps, or the like encompassed by the present disclosure have the meaning ascribed in U.S. patent law and the term is open-ended, allowing for the presence of more than that which is recited so long as basic or novel characteristics of that which is recited is not changed by the presence of more than that which is recited, but excludes prior art embodiments. In this specification when using an open ended term, like "comprising" or "including," it is understood that direct support should be afforded also to "consisting essentially of" language as well as "consisting of" language as if stated explicitly and vice versa.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Any steps recited in any method or process claims may be executed in any order and are not limited to the order presented in the claims unless otherwise stated.

In one invention embodiment, there is provided a faceplate border device for covering and/or minimizing exposure of an exposed perimeter side or edge of a screen protector (i.e. substantially transparent barrier) that is coupled to a mobile electronic device. In one embodiment, the faceplate of the electronic device can have a curved or rounded perimeter edge. In one embodiment, the curved our rounded perimeter edge can be on the viewing screen. The use of a border in combination with a screen protector can reduce or minimize physical contact with a perimeter side or edge of the screen protector by other objects, or by a user. Further, the use of such a border can provide other benefits like protection for any portions of the faceplate not covered by the screen protector, as well as, the mobile device's perimeter edge and perimeter sides, or a portion thereof. Such protection can minimize or prevent lifting or peeling around the perimeter sides and edges of the screen protector and prevent debris accumulation around and under the perimeter edges of the screen protector. Further, such a border can provide other decorative or structural integrity benefits to the mobile electronic device. In some embodiments, the border device can be used without a screen protector.

Figure 2:
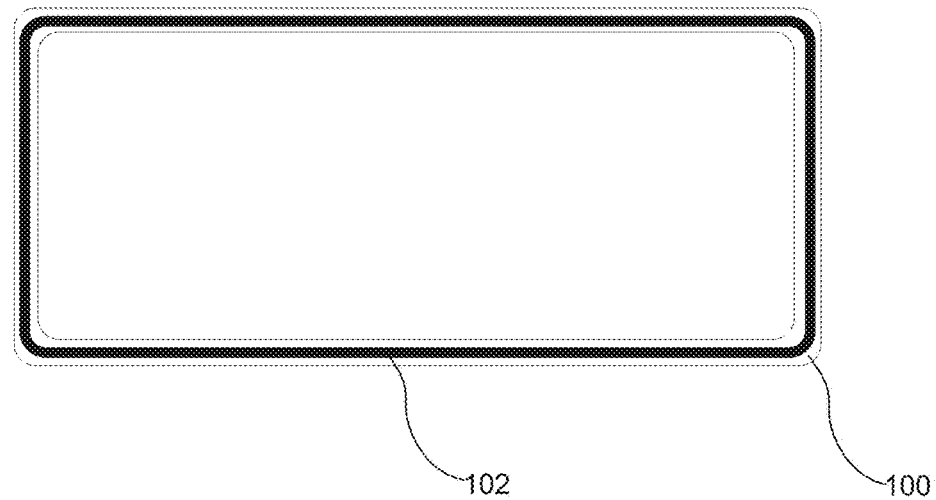
FIG. 2 schematically shows a view of the attachment side of a faceplate border according to one invention embodiment.

The faceplate border has an interior edge and an exterior edge. The interior edge is configured to be oriented towards the screen protector, when applied to a mobile electronic device. The exterior edge is configured to be oriented away from the screen protector, when applied to a mobile electronic device. The device also includes an attachment surface and an exterior surface. The exterior surface 100, as shown in FIG. 1, extends between the interior edge 101, and exterior edge 103. The exterior surface is configured to be oriented away from the mobile electronic device. The attachment surface extends between the interior and exterior edges, is configured to be oriented towards the mobile electronic device, and can have a shape that substantially matches the shape of the mobile electronic device where the attachment surface is to be attached. In another embodiment, the attachment surface can include a curved shape that substantially matches the shape of the curved or rounded perimeter edge of the mobile electronic device. The curved or rounded perimeter edge can be part of the viewing screen and/or part of the housing for the mobile electronic device. Alternatively, the attachment surface can include a portion that inversely corresponds to the shape of the perimeter edge of the viewing screen. The attachment surface of the border 100, can include an adhesive layer 102, as shown in FIG. 2. When the attachment surface includes an adhesive layer, the adhesive layer can be used to attach the border to the mobile electronic device. The attachment surface alternatively can be attached to the device using an adhesive without including an adhesive layer. In either case, the adhesive can comprise: acrylic based polymers, acrylic emulsion polymers, natural elastomeric polymers, synthetic elastomeric polymers, elastomeric copolymer microspheres, vinyl ethers, silicone, or combinations thereof.

Figure 3:
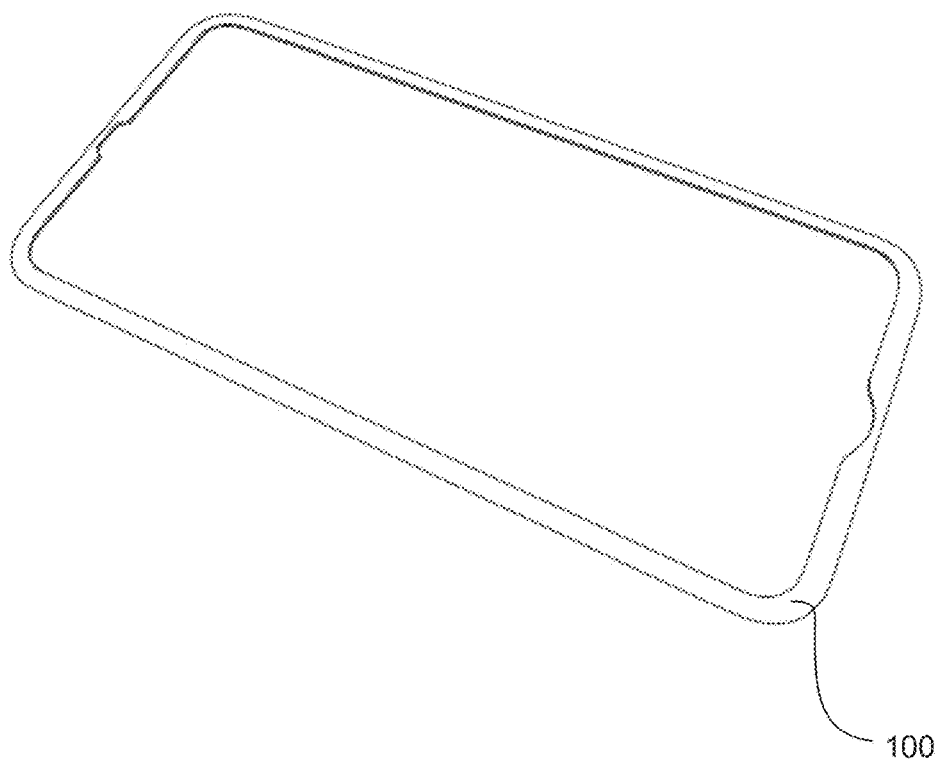
FIG. 3 shows a perspective view of a faceplate border device according to one invention embodiment.

The border can be configured in a variety of shapes and the shape of the border will vary based on the shape of the viewing screen of the mobile electronic device. In some instances, the border 100 can be a rectangular shape and can include cutouts that allow the user to access features of the device, as shown in FIG. 3. In other instances, the border can be circular. In yet other instances, the border can be a polygon. In yet other embodiments, the border can have an arcuate shape and can also be tapered.

The border can also be configured to surround the entire perimeter of a screen protector or only extend along a portion thereof. In some embodiments, the border can be configured to extend along one side or edge of the screen protector. In other embodiments, the border can be configured to extend along two sides or edges, or three sides or edges, or four sides or edges of the screen protector, etc. . . . . In one embodiment, the border can surround and abut the entire perimeter of the screen protector. In some embodiments, the border will abut at least one perimeter side or edge of the screen protector.

The border can further be configured to interface with the screen protector in a variety of manners. In one embodiment the border can overlap at least one side or edge of the screen protector. In other embodiments, the border can abut at least one perimeter side or edge of the screen protector. When the border abuts the perimeter sides or the perimeter edges of the screen protector, the shape of interior side of the border can match the shape of the perimeter side or perimeter edge of the screen protector allowing for a snug fit between the screen protector and the border. In other embodiments, the border will overlap at least one perimeter side or perimeter edge of the screen protector.

Figure 4:
FIG. 4 shows a top view of a faceplate border device according to one invention embodiment.
Figure 5:
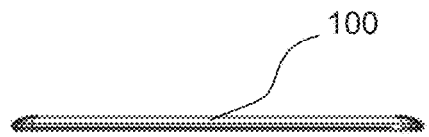
FIG. 5 shows a bottom view of a faceplate border device according to one invention embodiment.

The border can also be in a variety of thicknesses. In one embodiment, the border can have a thickness at the point of abutment or overlap that is equal to the thickness of the screen protector on the mobile electronic device. Alternatively the border can be thicker than or have a portion that is thicker than the thickness of the screen protector. In another embodiment, the border can be thinner than the thickness of the screen protector. In a further embodiment the border can vary in thickness. FIGS. 4 and 5 show a top and bottom view of the border 100 that varies in thickness and has a rounded or arcuate shape. Specifically, in some embodiments the border can have an exterior perimeter side with a thickness or height that has a thickness or height ratio to an interior side of from about 1:5 to about 1:1. In other words, the thickness or height of the interior side can be 5 times thicker or higher than the exterior perimeter side. In other aspects the ratio can be from about 1:10 to about 1:2, from about 1:7 to about 1:3, or from about 1:2 to about 5:9. In one specific embodiment, the border can have a thickness or height at the exterior perimeter side of about 0.20 mm and a thickness or height at the interior side of about 0.40 mm. In another specific embodiment, the exterior perimeter side can have a height or thickness of from about 0.05 mm to about 0.8 mm. In yet another embodiment, the height or thickness can be from about 0.1 mm to about 0.3 mm. In a further embodiment, the interior side can have height or thickness of from about 0.05 mm to about 1 mm. In another embodiment the height or thickness can be from about 0.2 mm to about 0.6 mm. In yet a further embodiment, the interior side can have a thickness or height at the interior edge of about 0.45 mm. In one embodiment, the interior side and the exterior perimeter side of the border device can be substantially the same height or thickness.

Figure 6:
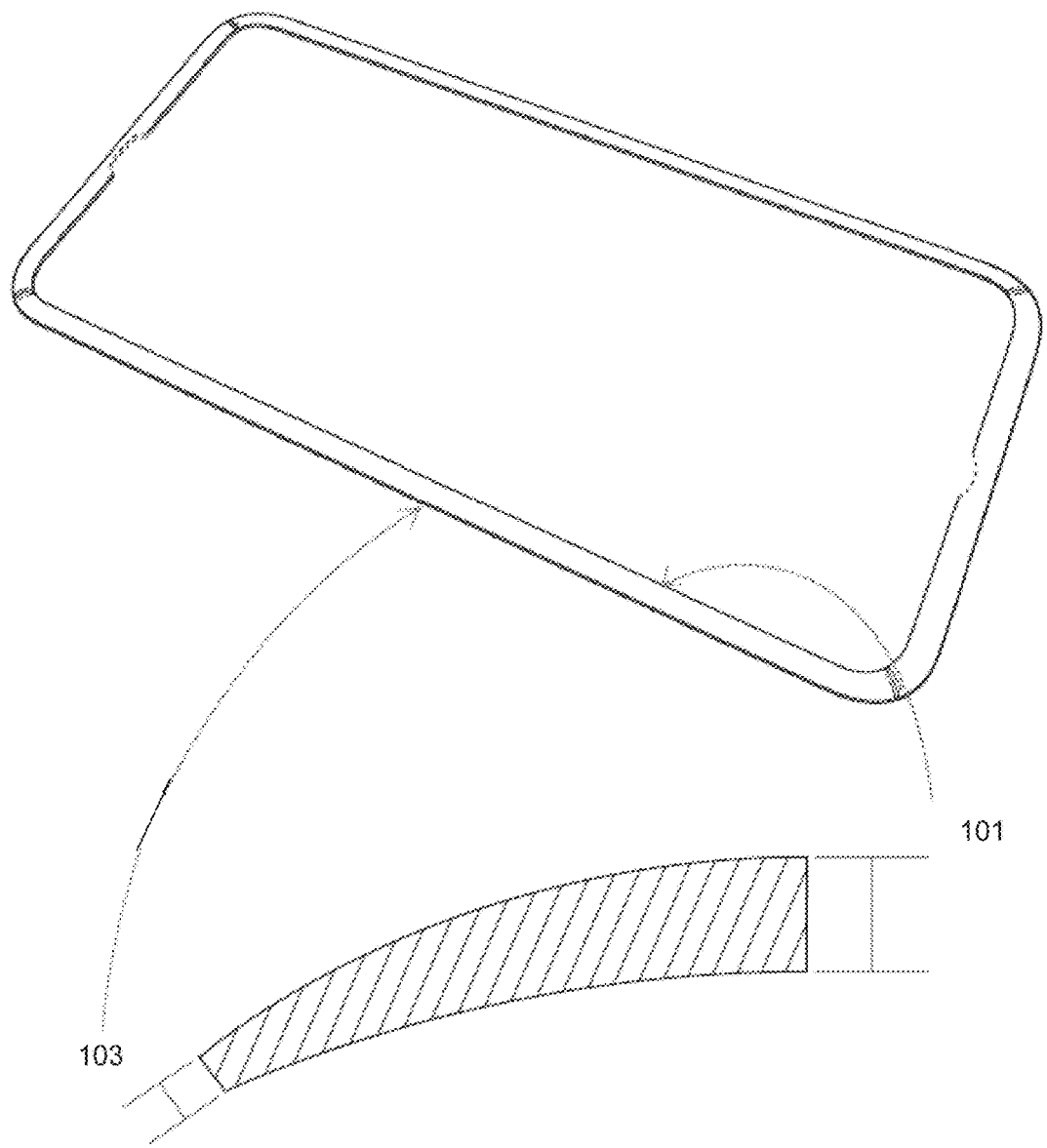
FIG. 6 is a view of a cross section of a faceplate border device showing an example of an embodiment articulating a thickness and shape of the border device in accordance with an invention embodiment.

As noted elsewhere, in some embodiments, the interior side can have a thickness or height that is taller or thicker than a thickness of a screen protector attached to the mobile electronic device. In some embodiments the thickness or height can be substantially the same as a thickness or height of the screen protector. In further embodiments, the thickness or height can be smaller than a thickness or height of the screen protector. In some embodiments the FIG. 6, schematically shows a border with a thicker interior edge and a thinner exterior edge. The border can also have an exterior surface that is rounded, curved, flat, or any combination thereof. In one embodiment where the border overlaps a perimeter side or edge of the screen protector, the aforementioned border device sizes, dimensions, ratios, and ranges of ratios can be reversed with the interior side having a thickness or height that is less than a thickness or height of an exterior perimeter side.

The border can comprise various materials. The border can be composed of plastic, ceramic, glass, rubber, neoprene, foam, leather, vinyl, knit fabric, fabric, polyurethane, silicone, polycarbonate, metal, carbon fiber, graphene, polymer, or combinations thereof. In one embodiment, when the border comprises a metal, the metal can be aluminum. In some embodiments, the border can comprise elastomeric materials or have elastomeric properties. In some embodiments, the border can be comprise a single molded piece. In another embodiment the border can comprise multiple pieces. In other embodiments, the border can comprise a composite material. In yet another embodiment, the border can comprise two or more different materials. When the border has elastomeric properties, the border can be attached to the mobile electronic device through suction, a cling-type adhesion (such as static cling), by gripping the exterior of the screen protector and/or the exterior of the mobile electronic device, or through other frictional or elastomeric forces that allow the border to snuggly surround the screen protector and/or the mobile electronic device.

The border can further be designed to represent the style and interests of the user. In some embodiments, the border can be manufactured in a wide variety of solid colors or exterior surface textures. In other embodiments, the border can be manufactured in a design or pattern having a decorative exterior surface.

Also presented, is a method of attaching a faceplate border to a mobile electronic device having a screen protector coupled or adhered thereto. In one embodiment, the method can include, adhering the border as described above by applying an adhesive to the attachment surface of the border device and contacting the attachment surface of the border with the mobile electronic device. In another embodiment, the border comprises elastomeric material and is attached to the mobile electronic device by engaging the device through suction, a cling-type adhesion, by gripping, or through other frictional or elastomeric forces. Further presented is a method of covering or minimizing exposure of a perimeter side or edge of a screen protector, comprising applying a border device as described herein to the faceplate to a mobile electronic device. Such a method is particularly useful when the mobile electronic device has a curved perimeter side or edge. Some electronic devices may have a substantially flat screen that abuts the housing on the faceplate of the device. The housing may have a curved perimeter side or edge. In other embodiments, the viewing screen may have a flat portion, but may extend further toward a perimeter of the device so that the screen itself (or at least the materials from which the screen is made) create or form part of the curved perimeter side or edge of the mobile electronic device rather than having the side or edge formed entirely from the housing. In essence, the faceplate can have a curved perimeter edge, whether it is entirely made of the screen, or whether it also includes the housing. In either case, the rounded perimeter side or edge may exacerbate the exposure of a perimeter side or edge of a screen protector coupled to the screen. This is particularly true when the screen protector has a perimeter side or edge that falls near where the perimeter side or edge of the mobile electronic device or faceplate (whether the housing or screen) begins to curve. The fact that the material underlying the screen protector falls away from it creates heightened exposure of the perimeter side or edge, including a perimeter edge that is proximate to the mobile electronic device (i.e. the edge of the screen protector perimeter side closest to the electronic device). This type of configuration is particularly problematic for screen protectors that are rigid or semi-rigid, such as those made of glass, since they are unable to flex to a degree required to meet the curved perimeter side or edge of the electronic device. The problem is even worse when the screen protector (i.e. barrier device) is substantially flat in order to match a flat portion of the screen.

Figure 7:
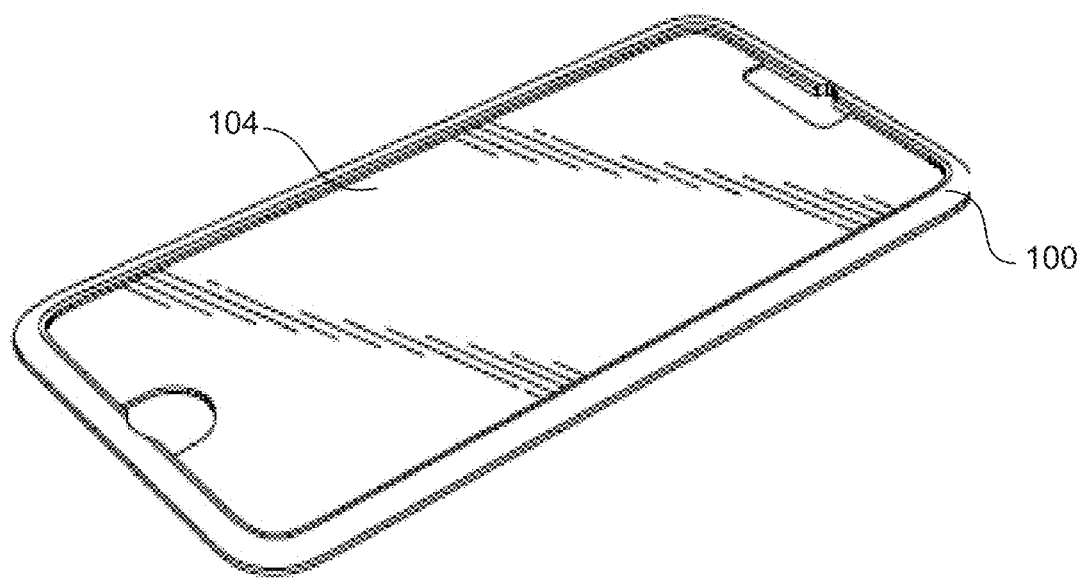
FIG. 7 shows a perspective view of the exterior side of a screen protector device according one embodiment wherein substantially transparent barrier component and the faceplate border device are coupled to or otherwise placed in specific orientation and proximity to one another that is useful with a mobile electronic.
Figure 8:
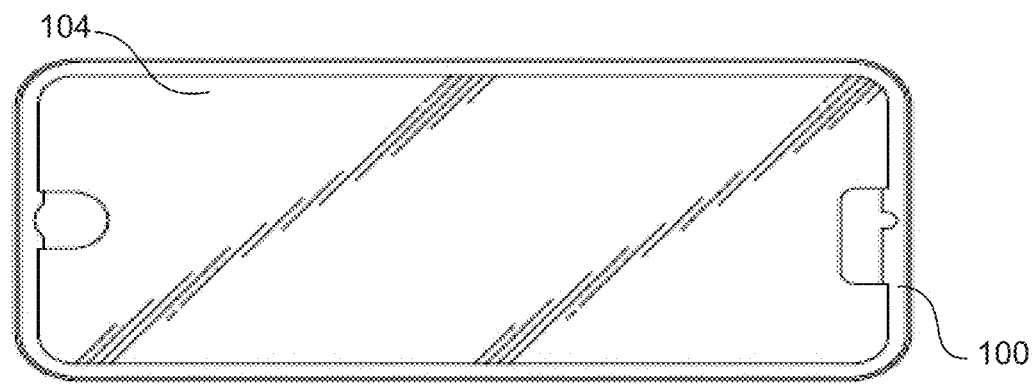
FIG. 8 shows a view of the attachment side of a screen protector device wherein the substantially transparent barrier component and the faceplate border are coupled or otherwise placed in specific orientation and proximity to one another in an embodiment where the border overlaps an edge or portion of the transparent barrier.
Figure 9:
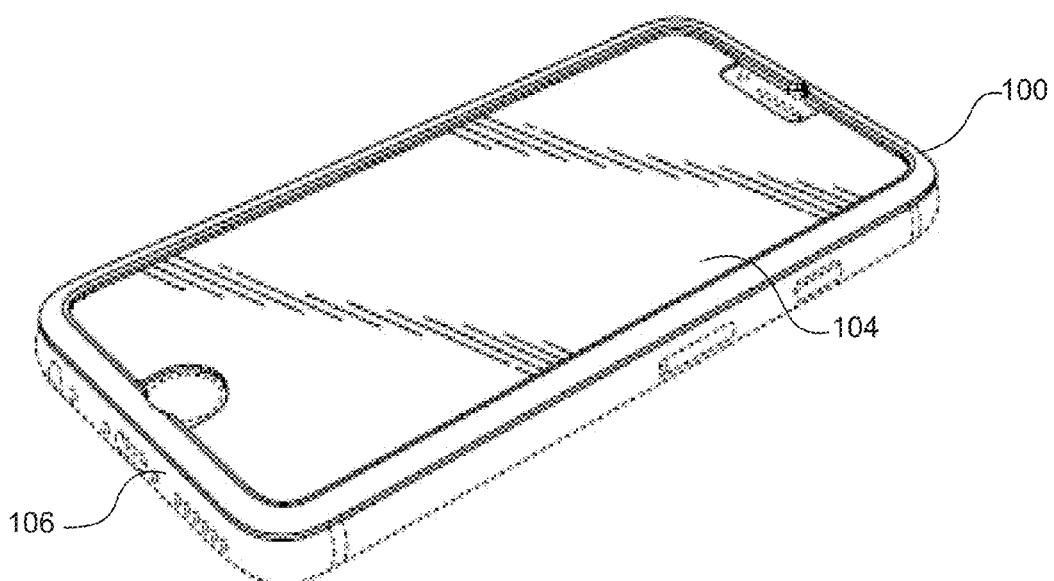
FIG. 9 schematically shows a perspective view of a faceplate border device and transparent barrier component, or a screen protector device according to an invention embodiment coupled to a mobile electronic device.
Figure 10:
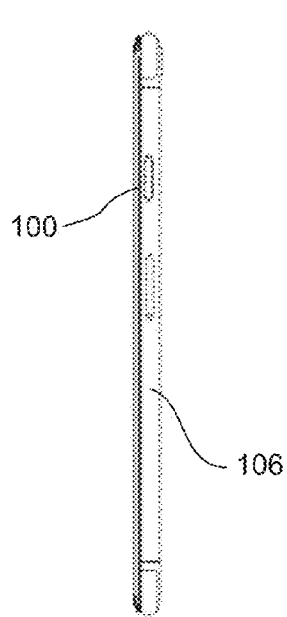
FIG. 10 shows a right side view of a faceplate border device and transparent barrier component, or a screen protector device according to an invention embodiment engaged with a mobile device.
Figure 11:
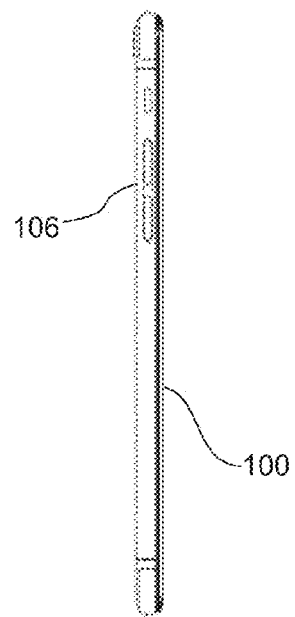
FIG. 11 shows a left side view of a faceplate border device and a transparent barrier component, or a screen protector device according to an invention embodiment engaged with a mobile device.
Figure 12:
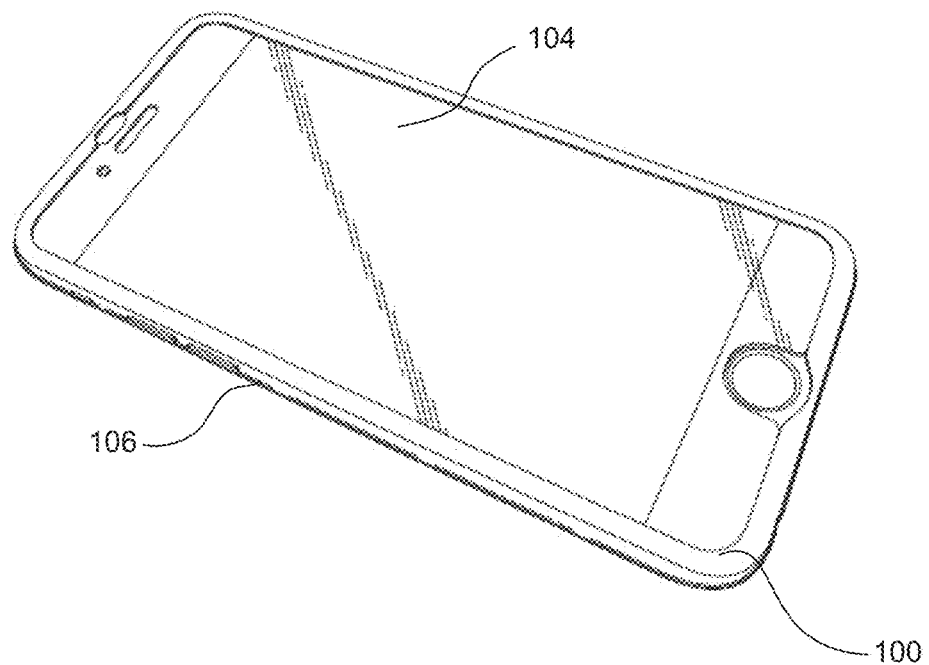
FIG. 12 shows a perspective view of a faceplate border device and transparent barrier component, or a screen protector device according to an invention embodiment coupled to a mobile electronic device.
Figure 13:
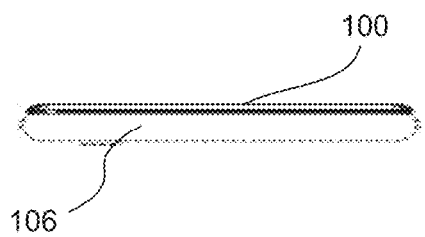
FIG. 13 shows a top end view of a faceplate border device and transparent barrier component, or a screen protector device according to one invention embodiment attached to a mobile electronic device.
Figure 14:
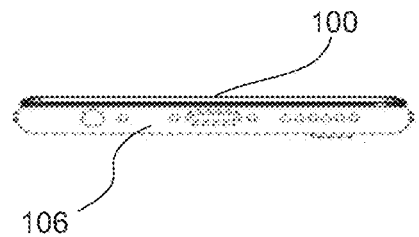
FIG. 14 shows a bottom end view of a faceplate border device and transparent barrier component, or a screen protector device according to one invention embodiment attached to a mobile electronic device.
Figure 15:
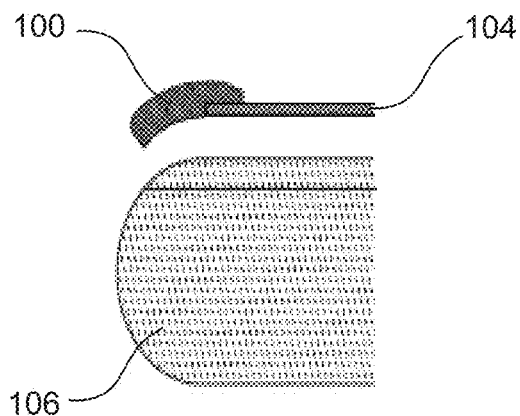
FIGS. 15-20 show cross sectional views of a faceplate border device and a transparent barrier component, or a screen protector device either about to be engaged with or coupled to a mobile electronic device, and demonstrates a variety of alternative arrangements and configurations for the placement and relationship between the faceplate border device and the transparent barrier component in accordance with different invention embodiments.
Figure 16:
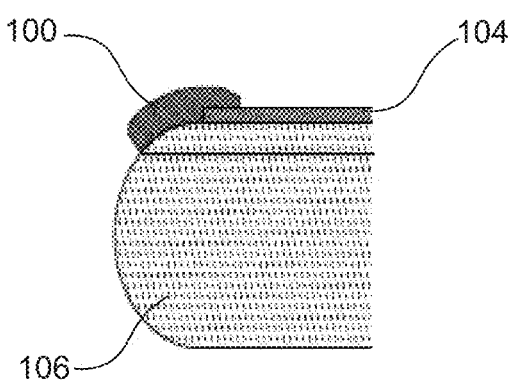
Figure 17:
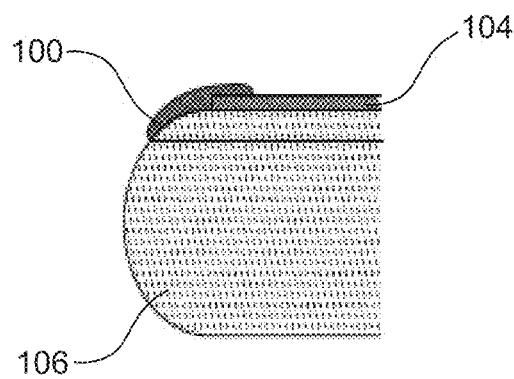
Figure 18:
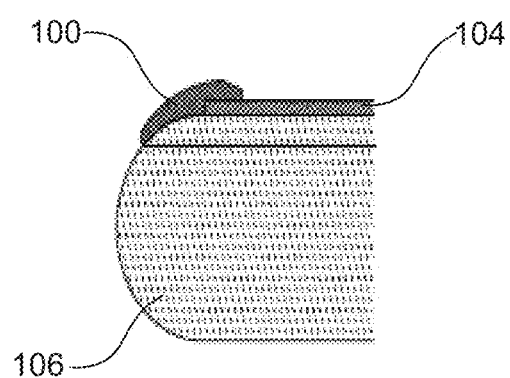
Figure 19:
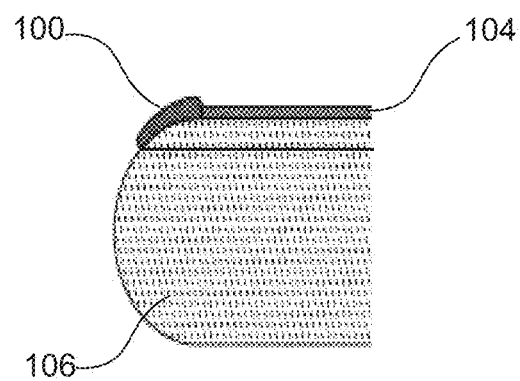
Figure 20:
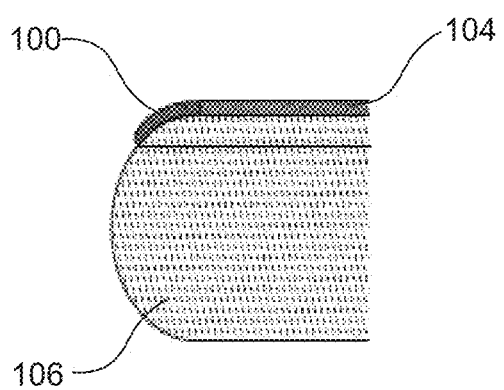

In another embodiment, a screen protector for a mobile electronic device is presented. The screen protector can include a substantially transparent barrier component that is configured to cover at least a portion of the screen or view screen of the mobile electronic device and a faceplate border as recited herein. In some embodiments, the mobile electronic device can have a curved viewing screen. In other embodiments, the mobile electronic device can have a curved housing. The barrier component and the faceplate border can either be separate components of the screen protector or can be configured as a single unit. FIG. 7 displays the front view and FIG. 8 back view of one embodiment of the screen protector wherein the barrier component 104 and faceplate border 100, are combined as a single unit or otherwise placed in specific orientation and proximity to one another.

The screen protector device is suitable for application to any mobile electronic device. However, the screen protector is especially suited for use with mobile devices having curved or beveled perimeter sides or edges, particularly a view screen with a curved or rounded perimeter edge. The barrier component can be configured to cover a substantial portion of the viewing screen. The faceplate border can be configured to extend along at least one edge of the barrier component and to engage a portion of the area of the curved or beveled perimeter edge of the view screen. In some embodiments, the faceplate border can match the shape of the edge of the perimeter device. Referring to FIGS. 9, 10, 11, 12, 13, and 14 the barrier component 104, rests upon the viewing screen of a mobile electronic device 106, and the faceplate border 100, surrounds a significant portion of the exterior of the barrier component. The barrier component 104, is not visible in the horizontal views shown in FIGS. 10 and 11, and in the top and bottom views shown in FIGS. 13 and 14. Alternatively, the border can be configured to engage only portions of the mobile electronic device and the barrier component. The use of barrier to cover the viewing screen allows for economical manufacturing of the barrier in a wide variety of materials, such as glass, that cannot be bent in a cost effective manner. At the same time, the faceplate border can be configured to allow for attachment of the barrier to mobile electronic device, and/or to prevent external debris from getting in between the barrier and the viewing screen of the mobile electronic device, and/or to minimize separation between the barrier and the viewing screen.

The barrier component is substantially transparent and designed to allow for viewing of the view screen and operation or navigation of the device through a touch interface that is provided by the view screen. The barrier component is also configured to allow the touch screen to function normally despite the presence of the barrier between the viewing screen and the user. Additionally, the barrier component can be configured to be optically clear to permit the user to see the image on the viewing screen.

In some aspects, the barrier component can be rigid. In another aspect, it can be semi-rigid. In yet another aspect, it can be flexible. The barrier component can be created from any suitable material. Preferably, the barrier is composed of glass or a polymer. In one most preferred embodiment, the barrier is glass. The glass can be made of thin tempered glass sheet and/or can be treated with an anti-glare coating. The polymer can be either a polymeric film or a sheet.

The barrier component can be attached to the viewing screen by either laying the barrier on top of the viewing screen, using the faceplate border to secure the barrier to the viewing screen, or by adhering the barrier directly to the viewing screen using an adhesive. When the barrier is merely placed on top of the viewing screen, it can merely rest against it or contact it. In some embodiments, the barrier can be suspended just above the viewing screen. In these situations, the border is used to secure the barrier to the device. When the barrier is adhered directly to the viewing screen an adhesive can be used.

The adhesive can be disposed on the attachment side of the barrier to bond or adhere the barrier to the viewing screen. The adhesive can be optically clear prior to and following application of the barrier. In some embodiments, the adhesive can exhibit a haze immediately following installation which substantially subsides as the adhesive cures. Clarity times can vary depending on the type of adhesive. In another aspect, the barrier and adhesive can be configured to be "dry" applied to the device. Additionally, the barrier and adhesive can be configured to be "wet" applied to the device. In some embodiments, the barrier and adhesive can be simultaneously configured for both wet and dry applications.

Adhesive materials can include polymers designed and formulated to exhibit the requisite viscoelastic properties resulting in a desired balance of tack, peel adhesion, and shear holding power. In one aspect, the adhesive can comprise a pressure sensitive adhesive. The adhesive can include a material selected from the group consisting essentially of: acrylic based polymers, acrylic emulsion polymers, natural elastomeric polymers, synthetic elastomeric polymers, elastomeric copolymer microspheres, vinyl ethers, silicone, or combinations thereof. Suitable pressure sensitive adhesive materials can contain, for example, a polymer as a principal constituent, such as acrylic type polymers, block copolymers, natural or recovered rubbers, styrene butadiene rubbers, ethylene and vinyl acetate random copolymers, ethylene vinyl acrylic terpolymers, polyisobutylene poly(vinyl ethers), etc. In a specific aspect, elastomers used in the adhesive can be based on acrylics, butyl rubber, ethylene-vinyl acetate, natural rubber, nitriles, silicone rubber, styrene block copolymers, styrene-butadiene-styrene, styrene-ethylene/butylene-styrene, styrene-ethylene/propylene, styrene-isoprene-styrene, vinyl ethers, etc. Useful elastomeric polymers that may be incorporated in the adhesive include natural rubber (polyisoprene), polybutadiene, synthetic polyisoprene, random styrenebutadiene polymers, styrene-butadiene block copolymers, multiarmed and repeating (SB) copolymers, styrene-butadiene-styrene block copolymers, styreneisoprene block copolymers, styrene-isoprene-styrene block copolymers, multiarmed styrene-isoprene, block copolymers, and the like. Other elastomers, such as the ethylene-propylene diene rubbers, styrene-ethylene/butylene, styrene block copolymers, styrene-ethylene/propylene-styrene block copolymers, and the like may also be used.

In addition to the aforementioned materials, other materials can be present in the adhesive to impart desired properties. For example, plasticizers, antioxidants, filler materials, and/or pigments can also be included in the adhesive compositions. Cutting agents such as waxes and surfactants also can be included in the adhesives. Light stabilizers, heat stabilizers, and UV absorbers or blockers also can be included in the adhesive compositions. Ultraviolet absorbers include benzo-triazol derivatives, hydroxy benzyl phenones, esters of benzoic acids, oxalic acid, diamides, etc. Light stabilizers include hindered amine light stabilizers, and the heat stabilizers include dithiocarbamate compositions such as zinc dibutyl dithiocarbamate, although other stabilizers may be suitable. The adhesive materials can contain a mixture of solid tackifying resins and liquid tackifying resins. In a particular aspect, a pressure sensitive adhesive can be based on an elastomer compounded with a suitable tackifier (e.g., a rosin ester).

The faceplate border can be configured in a variety of manners to interact with the barrier. In one embodiment, the border can be configured to be coupled to at least one edge of the barrier. In another embodiment the border can be configured to be adjacent to at least one edge of the barrier. In some embodiments, the border may extend along all edges or the entire perimeter of the barrier. In other embodiments, the border can be configured to cover select portions of the perimeter of the barrier. In further embodiments, the border can be configured to abut the perimeter edge of the barrier.

As shown in FIGS. 15-20, the faceplate border 100, can be configured to engage the barrier component 104, and the mobile electronic device 106, in a variety of manners. The attachment surface on the border can have a shape that substantially matches a shape of the device. In some embodiments, the mobile electronic device will have a curved or rounded viewing screen and the border will match the curvature of the viewing screen. In other embodiments, the mobile electronic device will have a curved or rounded housing and the attachment surface of the border will match the curvature of the housing. In other embodiments, the attachment surface will extend on a portion of the viewing screen and the housing of the viewing screen and will match the shape of the portions of the viewing screen and the housing where it is attached. The border can also have a variety of interior edge shapes. In one embodiment, the shape of interior edge can match the shape of the edge of the barrier component allowing for a snug fit between the barrier and the border. In yet another embodiment, the interior edge can inversely correspond to the shape of the face of the barrier. The border can be configured in a manner such that the border minimizes exposure of a vertical side of the barrier at the point of abutment.

Additionally, the faceplate border may have a variety of physical characteristics or properties, such as varying surface shapes, thicknesses, etc. as recited herein.

The faceplate border can be composed of various suitable materials. In some aspects, the border can comprise a material that is different than that of the barrier component. In other aspects, the border can comprise the same material as the flat barrier. The border can be composed of plastic, ceramic, glass, rubber, neoprene, foam, leather, vinyl, knit fabric, fabric, polyurethane, silicone, polycarbonate, metal, carbon fiber, polymer, or a combination thereof. When the faceplate border is comprised of a metal, the metal can be aluminum. In some embodiments, the faceplate border can be comprised of elastomeric materials. In some embodiments, the border can be comprised of a single material. In other embodiments, the border can be comprised of a composite material. In yet another embodiment, the border can be comprised of two or more different materials. When the boarder is comprised of two or more separate materials, the border can include a softer material towards the exterior of the electronic mobile device and a harder material towards the interior of the electronic mobile device; wherein, soft and hard are determined relative to one another.

As mentioned, the faceplate border can be designed to represent the style and interests of the user. In some embodiments, the border can be manufactured in a wide variety of solid colors. In other embodiments, the border can be manufactured in a design or pattern having a decorative exterior surface.

The border can be attached to the electronic mobile device using a variety of methods. In one embodiment the border can be attached to the mobile electronic device using an adhesive. The adhesive can include any of the adhesives discussed above. In one embodiment, the adhesive can be a pressure sensitive adhesive.

Figure 21:
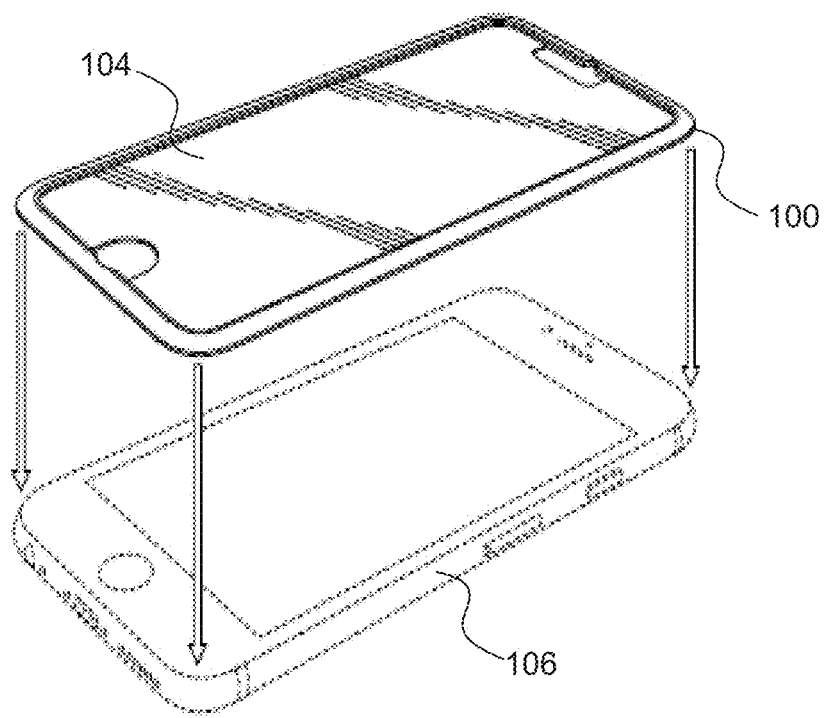
FIGS. 21 and 22 show a mobile electronic device wherein a faceplate border device and transparent barrier component, or a screen protector device according to an invention embodiment is being coupled to the front of a mobile electronic device and a bottom casing that is different than or substantially similar to the faceplate border device and transparent barrier component, or screen protector device on the front is being coupled to the back of a mobile electronic device in order to enclose the front and back of the mobile electronic device.
Figure 22:
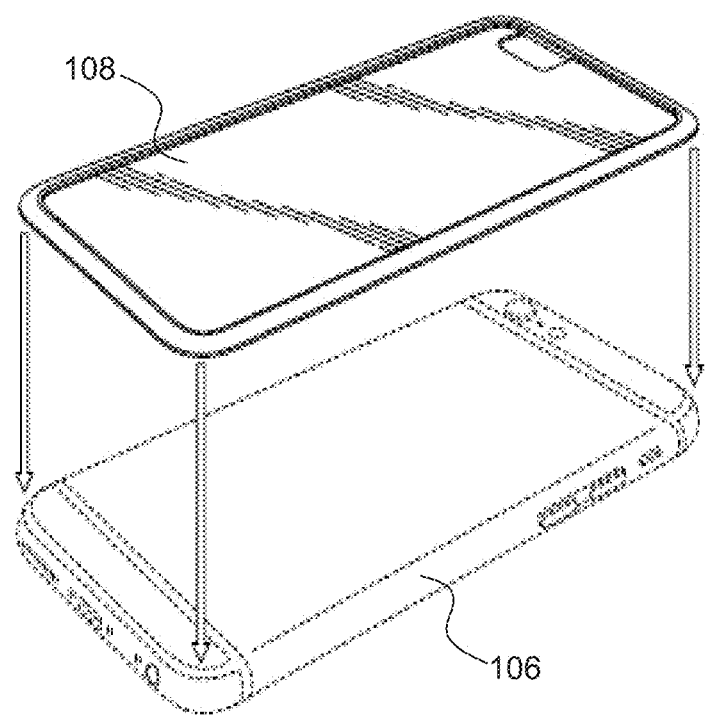

In one embodiment, the screen protector presented above, can further include a bottom casing. In this embodiment, the screen protector becomes integrated into a protective case for the mobile electronic device. The protective case can be designed to completely enclose the mobile electronic device or the protective case can be designed to enclose only portions of the mobile electronic device. FIGS. 21 and 22 show one embodiment of a mobile electronic device 106, being covered in a barrier component 104 and faceplate border 100 on the face of the device (FIG. 21), and being covered in a bottom casing 108 on the back of the device 106 (FIG. 22). The bottom casing can be comprised of a material that is the same or different from the faceplate border. The bottom casing can be comprised from plastic, ceramic, glass, rubber, neoprene, foam, leather, vinyl, knit fabric, fabric, polyurethane, silicone, polycarbonate, metal, carbon fiber, polymer, or a combination thereof. When the bottom casing comprises a metal, the metal can be aluminum. In some embodiments, the bottom casing can be comprised of elastomeric materials. In some embodiments, the bottom casing can be comprised of a single material. In other embodiments, the bottom casing can be comprised of a composite material. In yet another embodiment, the bottom casing can be comprised of two or more different materials. When the bottom casing is comprised of two or more separate materials, the bottom casing can include a softer material towards the exterior of the electronic mobile device and a harder material towards the interior of the electronic mobile device; wherein, soft and hard are determined relative to one another. In this embodiment, the border can also include a softer material towards the exterior and a harder material towards the interior allowing the casing to better absorb shock in the event of a fall.

When a bottom casing is used in conjunction with the barrier component and faceplate border: the bottom casing, barrier component, and faceplate border can be designed to attach to one another. In this embodiment, no adhesive is necessary to attach the screen protector/case to the electronic mobile device. Integrating the barrier, border, and bottom casing can be done using any variety of mechanisms, including but not limited to include, tabs, clips, hinges, and/or integrating component parts. In one embodiment, the border and bottom casing can be integrated into one component that works with the flat barrier to create the protective casing. In another embodiment, the border, bottom, and barrier are each adhered using an adhesive to the electronic mobile device. The adhesive is contemplated as previously discussed above.

Additionally presented, is a method for attaching a screen protector to a mobile electronic device. The method can include attaching an adhesive to the viewing screen of the electronic mobile device, using the adhesive to adhere a barrier component to the viewing screen of the mobile electronic device, and then placing a faceplate border along at least one edge of the barrier. The method can further include using the adhesive to adhere the faceplate border to the mobile electronic device. Alternatively, the method can include placing a barrier component over the viewing screen of the mobile electronic device and placing a faceplate border that engages a portion of the barrier and a portion of the mobile electronic device on the mobile electronic device. In this method, the barrier can be attached using an adhesive or the border can be comprised of elastomeric material and the barrier can be secured based on suction, a cling type adhesion or through other frictional or elastomeric forces to the mobile electronic device. In a third method, the screen protector can be adhered to the viewing device as part of a case. In this embodiment the barrier component, faceplate border, and bottom casing can be designed to integrate with one another and can be attached by integrating the pieces together as designed.

Further presented, is a method of minimizing separation of a screen protector from a viewing screen. The method comprises placing a screen protector on a viewing screen or acquiring a mobile electronic device having a screen protector attached to the viewing screen and placing a faceplate border along at least one edge of the screen protector. The border engages at least one edge of the viewing screen and minimizes exposure of at least one side of the screen protector at the point of abutment. The screen protector can either merely rest on top of the viewing screen or can be attached to the viewing screen using an adhesive. The border can either be attached using an adhesive or can be comprised of an elastomeric material that allows the barrier to be secured based on suction, a cling type adhesion or through other frictional or elastomeric forces to the mobile electronic device. When the method includes attaching the border using an adhesive the border can have an attachment surface with a shape that substantially matches the shape of the device where the border is to be attached.

Figure 23:
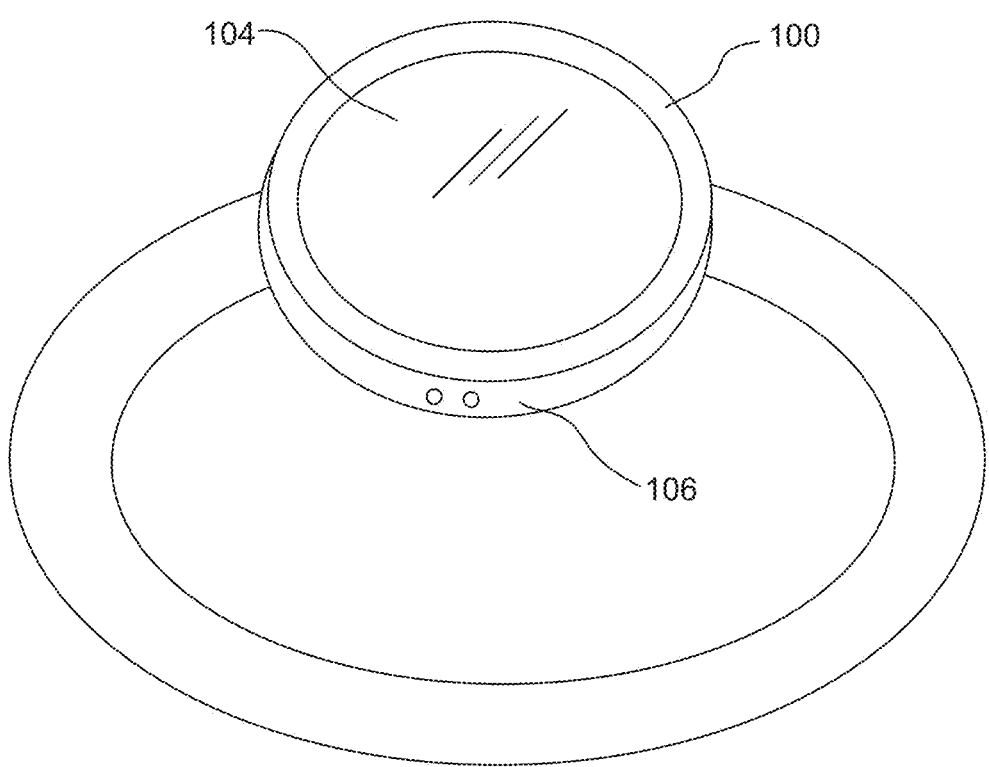
FIG. 23 shows a perspective view of a faceplate border device and transparent barrier component or a screen protector device according to one embodiment that is coupled to a circular mobile electronic device, such as a watch.
Figure 24:
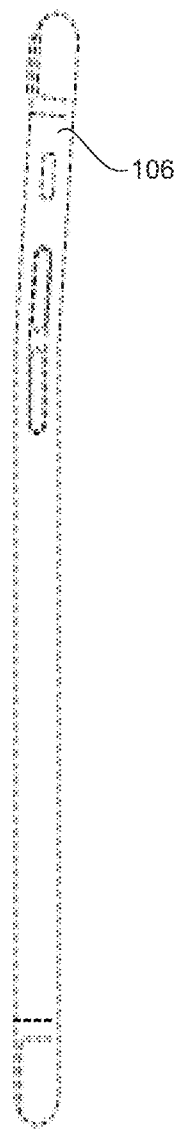
FIG. 24 shows a side view of a mobile electronic device that has been damaged by bending.
Figure 25:
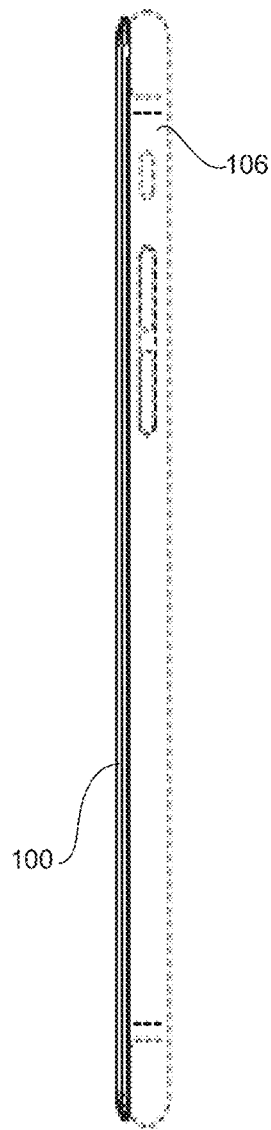
FIGS. 25 and 26 show side views of an embodiment of a faceplate border device and transparent barrier component device, or a screen protector engaged or coupled to a mobile device either on one or both sides wherein the faceplate border device and transparent barrier component, or screen protector protects the mobile device from bending or other flexing or shape distortion.
Figure 26:
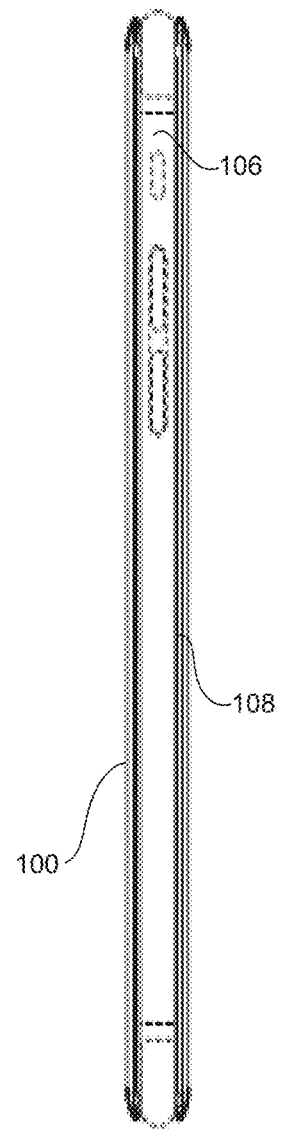

The faceplate border, screen protector, and methods described above can be applied to any mobile electronic device. The faceplate border and screen protector are particularly suited for a mobile electronic device having a curved or beveled edge. Examples of such devices include personal electronic devices, cell phones, personal digital assistants, cameras, laptops, tablets, calculators, digital music players, digital movie players, or watches. FIG. 23 shows one embodiment of the screen protector having a barrier component 104, and a faceplate border 100, on a mobile electronic device 106, with a circular shaped viewing screen. The screen protector having a faceplate border 100, and flat barrier (not visible) can further be used alone as shown in FIG. 25 or in combination with a bottom casing 108, as shown in FIG. 26, to enhance the structural integrity of the mobile device 106, and to prevent bending, flexing, or other shape distortion of the mobile electronic device 106, as shown in FIG. 24. When the screen protector is used in combination with a bottom casing the structural integrity of the mobile device is further protected.

Figure 27:
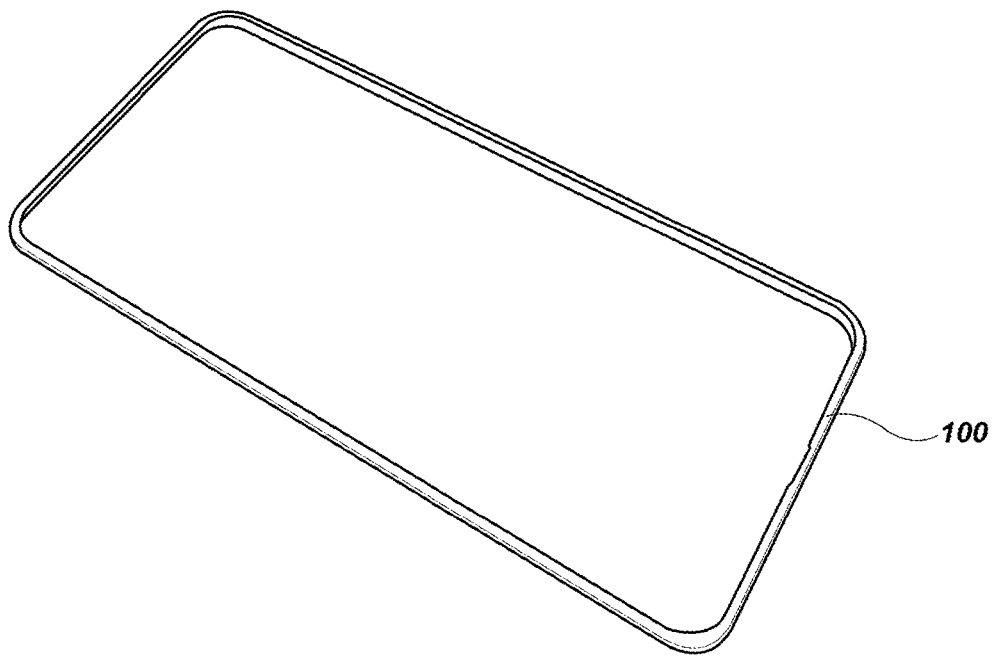
FIG. 27 shows a front perspective view displaying an exterior side of a faceplate border device for covering an interface between a perimeter edge of a transparent barrier component and a mobile electronic device.
Figure 28:
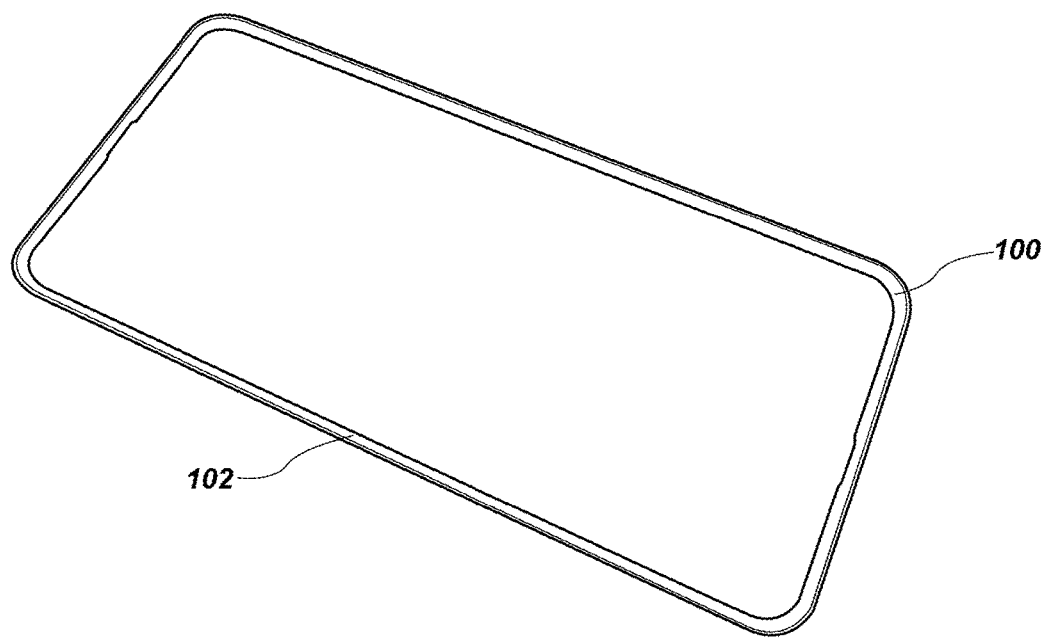
FIG. 28 shows a back perspective view of the border device shown in FIG. 27 and displays the attachment side of the faceplate border device.
Figure 29:
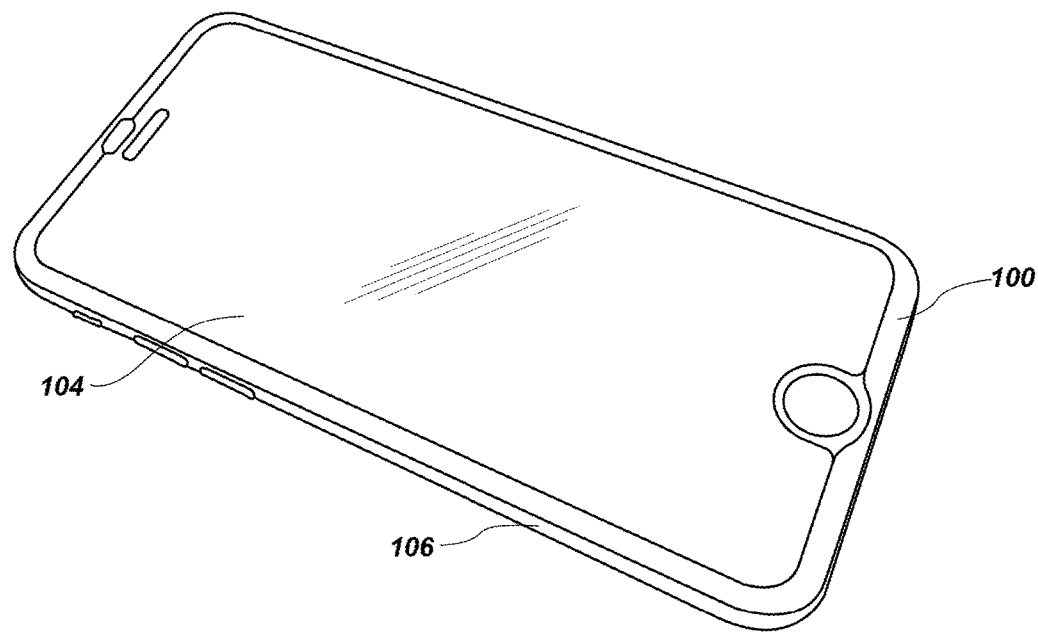
FIG. 29 shows an embodiment of a screen protector coupled to a mobile device showing a transparent barrier component and the faceplate border device installed on a mobile electronic device.
Figure 30:
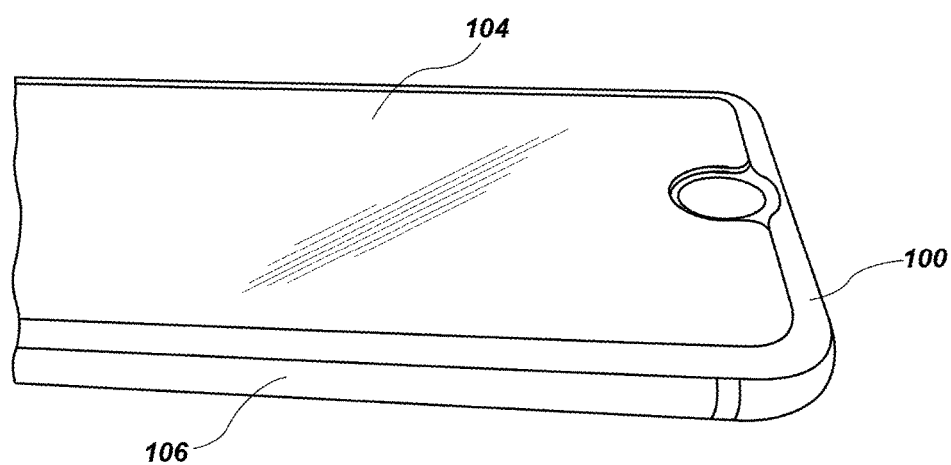
FIG. 30 shows of an embodiment of a screen protector coupled to a mobile device showing a transparent barrier component and the faceplate border installed on a mobile electronic device, where the barrier component and faceplate border abut one another and have substantially the same thickness at the point of abutment.

FIGS. 27 and 28 depict images of the faceplate border 100 that can be used in combination with the barrier component or alone on a device having a screen protector attached thereto. FIG. 27 depicts the exterior side of the faceplate border 100. FIG. 28 depicts the attachment side of the faceplate border 100 and includes an adhesive layer 102. FIGS. 29 and 30 depict images of the screen protector on an exemplary mobile electronic device 106; where the faceplate border 100 and barrier component 104 abut one another and have substantially the same thickness at the point of abutment.

Additionally presented herein are assemblies. In one embodiment, an assembly comprises a mobile electronic device, a barrier component, and a faceplate border. In another embodiment, an assembly comprises a mobile electronic device with a screen protector attached thereto and a faceplate border

EXAMPLES

The following examples pertain to further embodiments.
In one example, a faceplate border for minimizing exposure of an edge of a screen protector coupled to a screen of a mobile electronic device, said border comprising:
an interior edge configured to be oriented toward the screen protector when the faceplate border engages the mobile electronic device;
an exterior edge configured to be oriented away from the screen protector when the faceplate border engages the mobile electronic device;
an attachment surface extending between the interior and exterior edges, said attachment surface configured to be oriented toward the mobile electronic device when the faceplate border engages the mobile electronic device and having a shape substantially matching a portion of the mobile electronic device to which the attachment surface is to be attached; and
an exterior surface extending between the interior and exterior edges and configured to be oriented substantially away from the mobile electronic device when the faceplate border engages the mobile electronic device.

In one example, the attachment surface of the faceplate border has a curved shape substantially matching a curved surface of the portion of the mobile electronic device to which the attachment surface is configured to be attached.

In one example, the attachment surface of the faceplate border has a curved shape that matches the curved surface of the mobile electronic device is a part of the screen.

In one example, the attachment surface of the faceplate border has a curved shape that matches the curved surface of the mobile electronic device, wherein the curved surface is a part of the mobile electronic devices housing.

In one example, the attachment surface of the faceplate border is at least partially coated with an adhesive layer configured to attach the faceplate border to the mobile electronic device.

In one example, the adhesive used to attach the faceplate border comprises acrylic based polymers, acrylic emulsion polymers, natural elastomeric polymers, synthetic elastomeric polymers, elastomeric copolymer microspheres, vinyl ethers, silicone, or combinations thereof.

In one example, the faceplate border is configured to abut at least one side edge of the screen protector.

In one example, the faceplate border has a thickness at the point of abutment that substantially matches a thickness of the perimeter edge of the screen protector.

In one example, the faceplate border has a thickness that varies from the exterior edge to the interior edge in a ratio from 1:5 to 1:1.

In one example, the faceplate border has a thickness that varies from the exterior edge to the interior edge in a ratio from 1:2 to 5:9.

In one example, the faceplate border has a thickness at the exterior edge of about 0.20 mm and a thickness at the interior edge of about 0.40 mm.

In one example, the faceplate border a thickness at the exterior edge of about 0.25 mm and a thickness at the interior edge of about 0.45 mm.

In one example, the faceplate border is configured to overlap at least one edge of the screen protector.

In one example, the faceplate border has an exterior surface that is rounded or curved.

In one example, the faceplate border has an exterior surface that includes a flat portion.

In one example, the faceplate border has a decorative exterior surface.

In one example, the faceplate border extends along at least two sides of the screen protector.

In one example, the faceplate border extends along at least three sides of the screen protector.

In one example, the faceplate border extends along an entire perimeter of the screen protector.

In one example, the faceplate border is a single molded piece.

In one example, the faceplate border comprises at least two types of materials.

In one example, the faceplate border includes a material selected from the group consisting essentially of: a plastic, a ceramic, a glass, a rubber, a neoprene, a foam, a leather, a vinyl, a knit fabric, a fabric, a polyurethane, a silicone, a polycarbonate, a metal, a carbon fiber, a polymer, or a combination thereof.

In one example, the faceplate border is a metal and the metal is aluminum.

In one example, the faceplate border comprises an elastomeric material and attaches to the mobile electronic device through suction, a cling-type adhesion, or through other frictional or elastomeric forces to an exterior of the screen protector or an exterior of the mobile electronic device.

In one example, the faceplate border is attached to a mobile electronic device that is a personal electronic device, a cell phone, a personal digital assistant, a camera, a laptop, a tablet, a calculator, a digital music player, a digital movie player, or a watch.

In one example, there is provided a method of attaching a faceplate border to a mobile electronic device having a screen protector adhered to a portion of a viewing screen on a mobile electronic device comprising;
adhering a faceplate border as described in claim 1, to a mobile electronic device by applying an adhesive to the attachment surface; and
placing the faceplate border around a portion of the mobile electronic device that the attachment surface is configured to.

In one example, there is provided a method of attaching a faceplate border to a mobile electronic device having a screen protector adhered to a portion of a viewing screen on a mobile electronic device comprising adhering a faceplate border, as described herein, made of an elastomeric material to a mobile electronic device by engaging the device through suction, a cling-type adhesion, or through other frictional or elastomeric forces.

In one example, there is provided a method of covering a side edge of screen protector comprising, applying the faceplate border, as described herein, to a faceplate on a mobile electronic device.

In one example, there is provided an assembly comprising an electronic mobile device, a screen protector on the faceplate of the electronic mobile device, and a faceplate border.

In one example, a screen protector for a mobile electronic device is presented comprising:
a substantially transparent, barrier component configured to cover all or a portion of a view screen and allow viewing and navigation of the view screen therethrough; and a faceplate border including, an interior edge configured to be oriented toward the barrier component; an exterior edge configured to be oriented away from the barrier component; an attachment surface extending between the interior and exterior edges, said attachment surface configured to be oriented toward the mobile electronic device when the faceplate border engages the mobile electronic device and having a shape substantially matching a portion of the mobile electronic device to which the attachment surface is to be attached; and an exterior surface extending between the interior and exterior edges and configured to be oriented substantially away from the mobile electronic device when the faceplate border engages the mobile electronic device.

In one example, the attachment surface of the screen protector can further have a curved shape substantially matching a curved shape of the portion of the mobile electronic device to which the attachment surface is to be attached.

In one example, the attachment surface of the screen protector can further have a curved shape substantially matching a curved shape of the portion of the mobile electronic device wherein the curved surface of the mobile electronic device is a part of the screen.

In one example, the attachment surface of the screen protector can further have a curved shape substantially matching a curved shape of the portion of the mobile electronic device wherein the curved surface of the mobile electronic is a part of its housing.

In one example, the barrier component of the screen protector is glass.

In one example, the barrier component of the screen protector is glass and the glass is tempered.

In one example, the barrier component of the screen protector is glass and the glass is treated with an anti-glare finish.

In one example, the barrier component of the screen protector comprises a polymer.

In one example, the barrier component of the screen protector is rigid, semi-rigid, or flexible.

In one example, the barrier component of the screen protector merely rests against the view screen of the mobile electronic device and is held in place by the faceplate border.

In one example, the barrier component of the screen protector is adhered to the view screen of the mobile electronic device using an adhesive.

In one example, the barrier component of the screen protector is adhered to the view screen of the mobile electronic device using an adhesive and the adhesive is a pressure sensitive adhesive.

In one example, the barrier component of the screen protector is adhered to the view screen of the mobile electronic device using an adhesive and the adhesive comprises acrylic based polymers, acrylic emulsion polymers, natural elastomeric polymers, synthetic elastomeric polymers, elastomeric copolymer microspheres, vinyl ethers, silicone, or combinations thereof.

In one example, the attachment surface of the faceplate border is at least partially coated with an adhesive layer configured to attach the faceplate border to the mobile electronic device.

In one example, the barrier component of the screen protector is attached using an adhesive that comprises acrylic based polymers, acrylic emulsion polymers, natural elastomeric polymers, synthetic elastomeric polymers, elastomeric copolymer microspheres, vinyl ethers, silicone, or combinations thereof.

In one example, the faceplate border of the screen protector comprises a material different from that of the barrier component of the screen protector.

In one example, the faceplate border of the screen protector includes a material selected from the group consisting essentially of: a plastic, a ceramic, a glass, a rubber, a neoprene, a foam, a leather, a vinyl, a knit fabric, a fabric, a polyurethane, a silicone, a polycarbonate, a metal, a carbon fiber, a polymer, or a combination thereof.

In one example, the faceplate border of the screen protector is a metal and the metal is aluminum.

In one example, the faceplate border of the screen protector comprises an elastomeric material and attaches to the mobile electronic device through suction, a cling-type adhesion, or through other frictional or elastomeric forces to an exterior surface of the barrier component or an exterior surface of the mobile electronic device.

In one example, the interior edge of the faceplate border of the screen protector includes a portion that matches a shape of an edge of the barrier component.

In one example, the interior edge of the faceplate border of the screen protector includes a portion that inversely corresponds to a shape of a face of the barrier component.

In one example, the faceplate border of the screen protector is configured to abut a perimeter edge of the barrier component of the screen protector.

In one example, the faceplate border of the screen protector has a thickness at the point of abutment that substantially matches a thickness of the barrier component of the screen protector.

In one example, the faceplate border of the screen protector has a thickness at the point of abutment that substantially matches a thickness of the barrier component of the screen protector and the faceplate border minimizes exposure of a vertical side of the barrier component at the point of abutment.

In one example, the faceplate border of the screen protector has a thickness that varies from the exterior edge to the interior edge in a ratio from 1:5 to 1:1.

In one example, the faceplate border of the screen protector has a thickness that varies from the exterior edge to the interior edge in a ratio from 1:2 to 5:9.

In one example, the faceplate border of the screen protector has a thickness at the exterior edge of about 0.20 mm and a thickness at the interior edge of about 0.40 mm.

In one example, the faceplate border of the screen protector has a thickness at the exterior edge of about 0.25 mm and a thickness at the interior edge of about 0.45 mm.

In one example, the interior edge of the faceplate border of the screen protector substantially matches a perimeter shape of the barrier component of the screen protector.

In one example, the exterior surface of the faceplate border of the screen protector is rounded or curved.

In one example, the exterior surface of the faceplate border of the screen protector includes a flat portion.

In one example, the exterior surface of the faceplate border of the screen protector is decorated.

In one example, the faceplate border of the screen protector extends along at least two edges of the barrier component of the screen protector.

In one example, the faceplate border of the screen protector extends along at least three edges of the barrier component of the screen protector.

In one example, the faceplate border of the screen protector extends along an entire perimeter edge of the barrier component of the screen protector.

In one example, the faceplate border of the screen protector is configured to overlap at least one side edge of the barrier component of the screen protector.

In one example, the faceplate border of the screen protector is a single molded piece.

In one example, the faceplate border of the screen protector is further coupled to a bottom casing and wherein the barrier component, faceplate border, and bottom casing enclose at least a portion of the mobile electronic device.

In one example, the faceplate border of the screen protector is further coupled to a bottom casing and the faceplate border and bottom casing comprise of at least two types of material.

In one example, the faceplate border of the screen protector is further coupled to a bottom casing and the faceplate border and bottom casing comprise of at least two types of material. The materials include a soft material towards the exterior portion and a hard material towards the interior portion that is closer to the mobile electronic device, and wherein soft and hard are determine relative to the perspective materials.

In one example, the faceplate border of the screen protector is attached to the mobile electronic device using an adhesive.

In one example, the faceplate border of the screen protector is attached to the mobile electronic device using an adhesive and the adhesive includes a material selected from the group consisting essentially of: acrylic based polymers, acrylic emulsion polymers, natural elastomeric polymers, synthetic elastomeric polymers, elastomeric copolymer microspheres, vinyl ethers, silicone, or combinations thereof.

In one example, the screen protector covers a mobile electronic device that is selected from the group consisting essentially of a personal electronic device, a cell phone, a personal digital assistant, a camera, a laptop, a tablet, a calculator, a digital music player, a digital movie player, or a watch.

In one example, there is provided a method of attaching a screen protector to a mobile electronic device comprising;
attaching an adhesive to a view screen of the electronic mobile device,
placing a substantially transparent, barrier component configured to cover all or a portion of the view screen of the mobile electronic device and allow viewing and navigation of the device therethrough over the adhesive and the view screen of the mobile electronic device, and
placing a faceplate border including, an interior edge configured to be oriented toward the barrier component, an exterior edge configured to be oriented away from the barrier component, an attachment surface extending between the interior and exterior edges, said attachment surface configured to be oriented toward the mobile electronic device when the faceplate border engages the mobile electronic device and having a shape substantially matching a portion of the mobile electronic device to which the attachment surface is to be attached, and an exterior surface extending between the interior and exterior edges and configured to be oriented substantially away from the mobile electronic device when the faceplate border engages the mobile electronic device, on the mobile electronic device.

In one example of the method above, the mobile electronic device is a personal electronic device, a cell phone, a personal digital assistant, a camera, a laptop, a tablet, a calculator, a digital music player, a digital movie player, or a watch.

In one example, there is a provided a method of attaching a screen protector to a mobile electronic device comprising;
placing a substantially transparent, barrier component configured to cover all or portion of a view screen of the mobile electronic device and allow viewing and navigation of the device therethrough, and
placing a faceplate border including, an interior edge configured to be oriented toward the barrier component, an exterior edge configured to be oriented away from the barrier component, an attachment surface extending between the interior and exterior edges, said attachment surface configured to be oriented toward the mobile electronic device when the faceplate border engages the mobile electronic device and having a shape substantially matching a portion of the mobile electronic device to which the attachment surface is to be attached, and an exterior surface extending between the interior and exterior edges and configured to be oriented substantially away from the mobile electronic device when the faceplate border engages the mobile electronic device, on the mobile electronic device.

In one example of the method above, the mobile electronic device is a personal electronic device, a cell phone, a personal digital assistant, a camera, a laptop, a tablet, a calculator, a digital music player, a digital movie player, or a watch.

In one example, there is a provided a method of minimizing separation of a screen protector from a viewing screen wherein the method comprises;
placing a barrier component on the viewing screen; and
placing a faceplate border including, an interior edge configured to be oriented toward the barrier component, an exterior edge configured to be oriented away from the barrier component, an attachment surface extending between the interior and exterior edges, said attachment surface configured to be oriented toward the mobile electronic device when the faceplate border engages the mobile electronic device and having a shape substantially matching a portion of the mobile electronic device to which the attachment surface is to be attached, and an exterior surface extending between the interior and exterior edges and configured to be oriented substantially away from the mobile electronic device when the faceplate border engages the mobile electronic device, on the mobile electronic device,
wherein the faceplate border extends along at least one edge of the barrier component and minimizes exposure of a vertical side of the barrier component at a point of abutment.

In one example, the method can include that the barrier component is attached to the view screen using an adhesive.

In one example, the method can include that the barrier component is merely placed on top of the viewing screen without using an adhesive and is held in place by the faceplate border.

In one example, the method can include that the faceplate border is attached to the view screen using an adhesive.

In one example of the method above, the mobile electronic device is a personal electronic device, a cell phone, a personal digital assistant, a camera, a laptop, a tablet, a calculator, a digital music player, a digital movie player, or a watch.

While the disclosure has been described with reference to certain examples, those skilled in the art will appreciate that various modifications, changes, omissions, and substitutions can be made without departing from the spirit of the disclosure. It is intended, therefore, that the disclosure, be limited only by the scope of the following claims.

What is claimed is:

1. A faceplate border for minimizing exposure of a perimeter side or edge of a screen protector coupled to a screen of a mobile electronic device, said border comprising:
an interior edge configured to be oriented toward the screen protector when the faceplate border is secured directly to the mobile electronic device;
an exterior edge configured to be oriented away from the screen protector when the faceplate is secured directly to the mobile electronic device;
an attachment surface extending between the interior and exterior edges, said attachment surface configured to be oriented toward the mobile electronic device when the faceplate border is secured directly to the mobile electronic device and having a shape substantially matching a portion of the mobile electronic device to which the attachment surface is to be secured; and
an exterior surface extending between the interior and exterior edges and configured to be oriented substantially away from the mobile electronic device when the faceplate border is secured directly to the mobile electronic device;
wherein the faceplate border is capable of being used without a screen protector and the faceplate border is configured to abut at least one perimeter side or edge of the screen protector; and wherein when the faceplate border is used with a screen protector the faceplate border has a thickness at a point of abutment with the screen protector that substantially matches a thickness of a perimeter edge of the screen protector.

2. The faceplate border of claim 1, wherein the attachment surface has a curved shape substantially matching a curved surface of the portion of the mobile electronic device to which the attachment surface is configured to be attached.

3. The faceplate border of claim 2, wherein the curved surface of the mobile electronic device is a part of the screen.

4. The faceplate border of claim 1, wherein the screen protector is substantially flat.

5. The faceplate border of claim 1, wherein the attachment surface is coated with an adhesive layer configured to secure the faceplate border directly to the mobile electronic device.

6. The faceplate border of claim 1, wherein the faceplate border has a thickness that varies from the exterior edge to the interior edge in a ratio from 1:5 to 1:1.

7. The faceplate border of claim 1, wherein the faceplate border has a thickness that varies from the exterior edge to the interior edge in a ratio from 1:2 to 5:9.

8. The faceplate border of claim 1, wherein the faceplate border has a thickness at the exterior edge of about 0.20 mm and a thickness at the interior edge of about 0.40 mm.

9. The faceplate border of claim 1, wherein the faceplate border has a thickness at the exterior edge of about 0.25 mm and a thickness at the interior edge of about 0.45 mm.

10. The faceplate border of claim 1, wherein the faceplate border extends along an entire perimeter of the screen protector.

11. The faceplate border of claim 1, wherein the mobile electronic device is a personal electronic device, a cell phone, a personal digital assistant, a camera, a laptop, a tablet, a calculator, a digital music player, a digital movie player, or a watch.

12. A method of minimizing exposure of a side edge of screen protector mounted on a mobile electronic device comprising, securing the faceplate border as recited in claim 1, to a faceplate of a mobile electronic device such that an interior side of the faceplate border is adjacent to a perimeter side or edge of the screen protector.

13. The method of claim 12, wherein the faceplate border is configured to abut at least one side edge of the screen protector.

14. A screen protector for a mobile electronic device comprising:
a substantially transparent, barrier component configured to cover all or a portion of a view screen and allow viewing and navigation of the view screen therethrough; and
a faceplate border including, an interior edge configured to be oriented toward the barrier component, an exterior edge configured to be oriented away from the barrier component; an attachment surface extending between the interior and exterior edges, said attachment surface configured to be oriented toward the mobile electronic device when the faceplate border secures directly to the mobile electronic device and having a shape substantially matching a portion of the mobile electronic device to which the attachment surface is to be secured, and an exterior surface extending between the interior and exterior edges and configured to be oriented substantially away from the mobile electronic device when the faceplate border secures to the mobile electronic device; and wherein the faceplate border is capable of being used without the barrier component and wherein a thickness of the barrier component and a thickness of the faceplate border substantially match at a point of abutment.

15. The screen protector of claim 14, wherein the barrier component and the faceplate border are separate pieces.

16. The screen protector of claim 14, wherein the barrier component and the faceplate border are integrated.

\* \* \* \* \*